(12) United States Patent
Li

(10) Patent No.: US 11,670,639 B2
(45) Date of Patent: Jun. 6, 2023

(54) FLEXIBLE DISPLAY SUBSTRATE AND PREPARATION METHOD THEREOF

(71) Applicant: Shenzhen China Star Optoelectronics Semiconductor Display Technology Co., Ltd., Shenzhen (CN)

(72) Inventor: Linshuang Li, Shenzhen (CN)

(73) Assignee: Shenzhen China Star Optoelectronics Semiconductor Display Technology cO., lTD., Shenzhen (CN)

( * ) Notice: Subject to any disclaimer, the term of this patent is extended or adjusted under 35 U.S.C. 154(b) by 405 days.

(21) Appl. No.: 16/627,366

(22) PCT Filed: Nov. 8, 2019

(86) PCT No.: PCT/CN2019/116763
§ 371 (c)(1),
(2) Date: Dec. 30, 2019

(87) PCT Pub. No.: WO2021/082065
PCT Pub. Date: May 6, 2021

(65) Prior Publication Data
US 2021/0358966 A1    Nov. 18, 2021

(30) Foreign Application Priority Data

Oct. 31, 2019 (CN) .......................... 201911051669.2

(51) Int. Cl.
*H01L 27/12* (2006.01)
*H01L 25/16* (2023.01)
(Continued)

(52) U.S. Cl.
CPC ...... *H01L 27/1218* (2013.01); *H01L 27/1262* (2013.01); *H01L 51/0097* (2013.01); *H01L 25/167* (2013.01); *H01L 27/3244* (2013.01)

(58) Field of Classification Search
CPC ................ H01I 27/1218; H01I 27/1262; H01I 27/3244; H01L 51/0097
See application file for complete search history.

(56) References Cited

U.S. PATENT DOCUMENTS

| 2004/0233374 A1* | 11/2004 | Yamazaki | ............. G02F 1/1341 |
| | | | 349/153 |
| 2014/0065389 A1* | 3/2014 | Loy | ........................ H01B 13/00 |
| | | | 156/247 |

(Continued)

FOREIGN PATENT DOCUMENTS

| CN | 104392901 | * | 3/2015 | ......... H01L 27/1218 |
| CN | 105789242 | * | 7/2016 | ............. H01L 27/32 |

(Continued)

*Primary Examiner* — Mohsen Ahmadi
(74) *Attorney, Agent, or Firm* — PV IP PC; Wei Te Chung; Zhigang Ma

(57) ABSTRACT

A flexible display device substrate and a preparation method thereof are provided. The flexible display device substrate includes a first flexible substrate, a toughening layer, a second flexible substrate, and an interweaved structure layer. The second flexible substrate is disposed on the first flexible substrate. The interweaving structure layer is disposed between the first flexible substrate and the second flexible substrate, wherein the interweaving structure layer is formed by a part of the first flexible substrate and a part of the second flexible substrate penetrating and interweaving with each other. The toughening layer is disposed at intervals between the first flexible substrate and the second flexible substrate, and the toughening layer and the interweaved structure layer are disposed alternately.

3 Claims, 4 Drawing Sheets

(51) Int. Cl.
*G09F 9/30* (2006.01)
*H01L 51/00* (2006.01)
*H01L 27/32* (2006.01)

(56) References Cited

U.S. PATENT DOCUMENTS

| | | | |
|---|---|---|---|
| 2015/0050721 A1* | 2/2015 | Asogawa | G01N 27/745 |
| | | | 204/603 |
| 2015/0060777 A1* | 3/2015 | Premutico | H01L 51/0097 |
| | | | 257/40 |
| 2015/0060869 A1* | 3/2015 | Ro | H01L 27/1266 |
| | | | 427/470 |
| 2016/0315276 A1 | 10/2016 | Seol et al. | |
| 2018/0013079 A1* | 1/2018 | Cai | H01L 51/5237 |
| 2018/0018907 A1* | 1/2018 | Kim | G09F 9/301 |
| 2018/0233682 A1* | 8/2018 | Lin | B32B 27/08 |
| 2020/0194531 A1* | 6/2020 | Xie | H01L 27/3276 |

FOREIGN PATENT DOCUMENTS

| | | | | |
|---|---|---|---|---|
| CN | 105789242 A | * | 7/2016 | H01L 27/32 |
| CN | 106684243 | | 5/2017 | |
| CN | 109360901 | | 2/2019 | |
| CN | 109713124 | | 5/2019 | |
| CN | 110098225 | | 8/2019 | |
| CN | 110112185 | | 8/2019 | |

* cited by examiner

FLEXIBLE DISPLAY SUBSTRATE AND PREPARATION METHOD THEREOF

RELATED APPLICATIONS

This application is a National Phase of PCT Patent Application No. PCT/CN2019/116763 having International filing date of Nov. 8, 2019 which claims the benefit of Chinese priority Patent Application No. 201911051669.2 filed on Oct. 31, 2019. The contents of the above applications are all incorporated by reference as if fully set forth herein in their entirety.

FIELD AND BACKGROUND OF THE INVENTION

The present disclosure relates to a field of flexible display devices, and more particularly to a flexible display device substrate and a preparation method thereof.

A flexible display panel has the advantages of being flexible, rollable, etc. compared with a traditional display panel based on a rigid glass. Therefore, the flexible display panel has become a research area for major panel manufacturers and R&D personnel. In addition, a transparent display panel gives the flexible display panel a wider application scenario.

In the prior art, a flexible substrate is generally coated on or adhered to a rigid substrate for the flexible display panel, and then a thin film transistor, a light emitting element, an encapsulation layer, etc. are prepared on the flexible substrate. Finally, the separation between the flexible substrate and the rigid substrate is realized by a laser lift-off (LLO) process or a mechanical lift-off process. In order to maintain the quality and stability of the device, the process temperature of the display panel is generally 300° C. or more than 400° C. For a low temperature polysilicon liquid crystal display (LTPS) process, its process temperature can be as high as 400° C. or more. Currently, flexible transparent substrates are mainly made of flexible organic materials, but most organic materials are difficult to meet the process temperature of the display panel. Therefore, transparent polyimide (PI) has become the most ideal material for the substrate of the flexible transparent display panel.

SUMMARY OF THE INVENTION

Technical problems: Due to poor bonding strength between a fluorinated transparent polyimide and a rigid glass substrate, a flexible display panel is easily warped, such that compatibility between layers is reduced. In addition, a double-layered transparent polyimide structure is introduced, for using a first transparent polyimide flexible substrate near the rigid support substrate as a sacrificial layer, and can increase the product yield to a certain extent after a laser lift-off. However, there is inertia in the interface between the first transparent polyimide flexible substrate and the second transparent polyimide flexible substrate, such that the bonding strength between the first transparent polyimide flexible substrate and the second transparent polyimide substrate is not effective. There is a risk that warpage and separation occur in the double-layered polyimide.

Therefore, it is necessary to provide a flexible display device substrate and a preparation method thereof to solve the problems existing in the prior art.

Technical solutions: The main object of the present disclosure is to provide a flexible display device substrate and a preparation method thereof, which can increase the bonding strength between the flexible substrate and the supporting substrate, and the bonding strength between the double-layered flexible substrate.

In order to achieve the foregoing object of the present disclosure, an embodiment of the present disclosure provides a flexible display device panel.

The flexible display device substrate includes: a first flexible substrate, a second flexible substrate disposed on the first flexible substrate and an interweaved structure layer disposed between the first flexible substrate and the second flexible substrate, wherein the interweaved structure layer is formed by a part of the first flexible substrate and a part of the second flexible substrate weaving and penetrating with each other.

According to a preferred embodiment of the present disclosure, the flexible display device substrate further comprises a toughening layer disposed at intervals between the first flexible substrate and the second flexible substrate, and the toughening layer and the interweaved structure layer are disposed alternately.

According to a preferred embodiment of the present disclosure, a bonding strength of the interweaving structure layer is greater than a first predetermined value. According to a preferred embodiment of the present disclosure, a thickness of the second flexible substrate is not lower than a thickness of the first flexible substrate.

An embodiment of the present disclosure further provides a flexible display device substrate, wherein the flexible display device substrate includes: a first flexible substrate, a second flexible substrate disposed on the first flexible substrate and an interweaved structure layer disposed between the first flexible substrate and the second flexible substrate, wherein the interweaved structure layer is formed by a part of the first flexible substrate and a part of the second flexible substrate weaving and penetrating with each other.

According to a preferred embodiment of the present disclosure, the flexible display device substrate further comprises a toughening layer disposed at intervals between the first flexible substrate and the second flexible substrate, and the toughening layer and the interweaved structure layer are disposed alternately.

According to a preferred embodiment of the present disclosure, a bonding strength of the interweaving structure layer is greater than a first predetermined value. According to a preferred embodiment of the present disclosure, a thickness of the second flexible substrate is not lower than a thickness of the first flexible substrate.

Furthermore, another embodiment of the present disclosure provides a preparation method of a flexible display device substrate, wherein the method includes: providing a rigid substrate; disposing an incompletely cured first flexible substrate on the rigid substrate; coating material of a second flexible substrate on the incompletely cured first flexible substrate such that the material of the second flexible substrate and the incompletely cured first flexible substrate penetrate and interweave with each other; performing a curing process such that an interweaved structure layer is formed in an inter-penetrated and interweaved area, wherein the interweaved structure layer is located between the first flexible substrate and the second flexible substrate; removing the rigid substrate.

According to a preferred embodiment of the present disclosure, wherein after the step of disposing the incompletely cured first flexible substrate on the rigid substrate, a toughening layer is further formed on a partial area of the first flexible substrate. According to a preferred embodiment of the present disclosure, a curing degree of the incompletely cured first flexible substrate ranges from 50% to 70%.

According to a preferred embodiment of the present disclosure, wherein material of the first flexible substrate and the second flexible substrate is a polyamic acid (PAA) solution; the material of the first flexible substrate and the material of second flexible substrate are respectively formed into a polyimide (PI) flexible substrate after the curing process is performed.

According to a preferred embodiment of the present disclosure, wherein the curing process comprises: heating up in a first predetermined time at a first temperature, and heating up in a second predetermined time at a second temperature and in another second predetermined time at a third temperature, wherein the third temperature is higher than the second temperature, and the second temperature is higher than the first temperature.

According to a preferred embodiment of the present disclosure, wherein the step of disposing the incompletely cured first flexible substrate on the rigid substrate further comprises: under a vacuum condition, heating the material of the first flexible substrate within a first temperature range and then heating the material of the first flexible substrate within a second temperature range, to form the incompletely cured first flexible substrate.

Beneficial effect: The beneficial effect of the present disclosure is that the flexible display device substrate and the preparation method thereof can improve defects, such as the warpage of the flexible transparent display substrate, the poor bonding strength between the double-layered polyimide, etc., and can also reduce the risk of damage and fragmentation of the transparent display substrate during the laser lift-off process. The preparation process risk and the production costs are reduced, and the product yield and quality are also improved.

BRIEF DESCRIPTION OF THE SEVERAL VIEWS OF THE DRAWINGS

In order to make the above content of the present disclosure understandable, the preferred embodiments are described in detail with the accompanying drawings as follows.

DESCRIPTION OF SPECIFIC EMBODIMENTS OF THE INVENTION

The following description of the embodiments with reference to the accompanying drawings is used to illustrate particular embodiments of the present disclosure. Furthermore, The directional terms referred in the present disclosure, for example, top, bottom, top, bottom, front, back, left, right, inside, outside, side, surrounding, center, horizontal, horizontal, vertical, vertical, axial, radial direction, uppermost layer or lowermost layer, etc. are only directions with regard to the accompanying drawings. Therefore, the directional terms used for describing and illustrating the present disclosure are not intended to limit the present disclosure.

Figure 1:
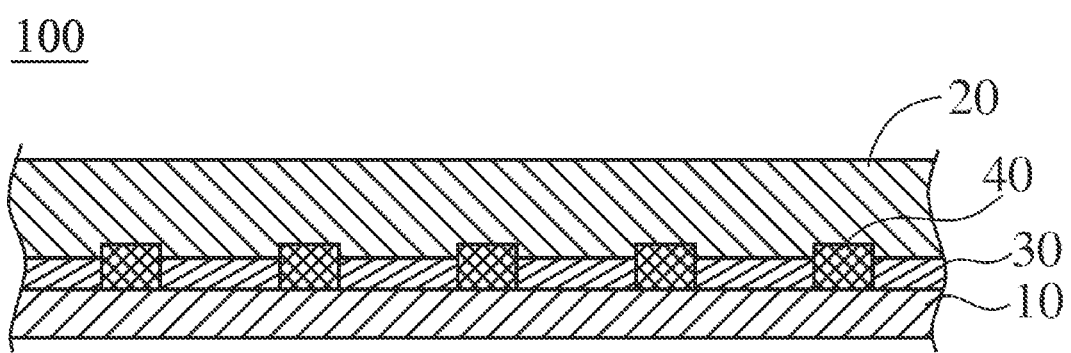
FIG. 1 is a schematic cross-sectional view of a flexible display device substrate of the present disclosure.

Referring to FIG. 1, a first embodiment of the present disclosure provides a flexible display device substrate 100 including a first flexible substrate 10 and a second flexible substrate 20 disposed on the first flexible substrate 10. In addition, an interweaved structure layer 30 is disposed between the first flexible substrate 10 and the second flexible substrate 20. In an embodiment of the present disclosure, the interweaved structure layer 30 is formed by a part of the first flexible substrate 10 and a part of the second flexible substrate 20 penetrating and interweaving with each other. In other words, the interweaved structure layer 30 has a double-layered flexible substrate.

In one embodiment of the present disclosure, the first flexible substrate 10 and the second flexible substrate 20 are transparent polyimide (PI) flexible substrates. Therefore, the interweaved structure layer 30 is a structure made of double-layered transparent polyimide flexible substrate.

In an embodiment of the present disclosure, the flexible display device substrate 100 further includes a toughening layer 40 disposed at intervals between the first flexible substrate 10 and the second flexible substrate 20, and the toughening layer 40 and the interweaved structure layer 30 are disposed alternately. Further, the toughening layer 40 and the interweaved structure layer 30 are both disposed between the first flexible substrate 10 and the second flexible substrate 20 at intervals, and the toughening layer 40 and the interweaved structure layer 30 are alternately arranged. In one embodiment of the present disclosure, the toughening layer 40 and the interweaved structure layer 30 are in contact with each other. Preferably, the toughening layer 40 is a single layer or a layered structure made of amorphous silicon, silicon oxide, or silicon nitride, and has a thickness ranging from 500 to 2000 angstroms.

In an embodiment of the present disclosure, the thickness of the second flexible substrate 20 is not less than the thickness of the first flexible substrate 10. Preferably, the thickness of the first flexible substrate 10 ranges from 5 to 10 um, and the thickness of the second flexible substrate 20 ranges from 10 to 20 um.

In one embodiment of the present disclosure, the bonding strength of the interweaved structure layer 30 is greater than a first predetermined value. Preferably, the first predetermined value may be, for example, 8.74 N/cm. Generally, the higher the bonding strength is, the more interface inertia can be reduced. The bonding strength of the interweaved structure layer 30 means the bonding strength between the first flexible substrate 10 and the second flexible substrate 20 in the interweaved structure layer 30.

In an embodiment of the present disclosure, the optical transmission of the first flexible substrate 10 and the second flexible substrate 20 is greater than 90%, the yellow index is less than 2, and the haze is less than 1. Preferably, the glass transition temperature of the first flexible substrate 10 and the second flexible substrate 20 is greater than 400° C., and the thermal expansion coefficient is lower than 40 ppm/° C.

Figure 2:
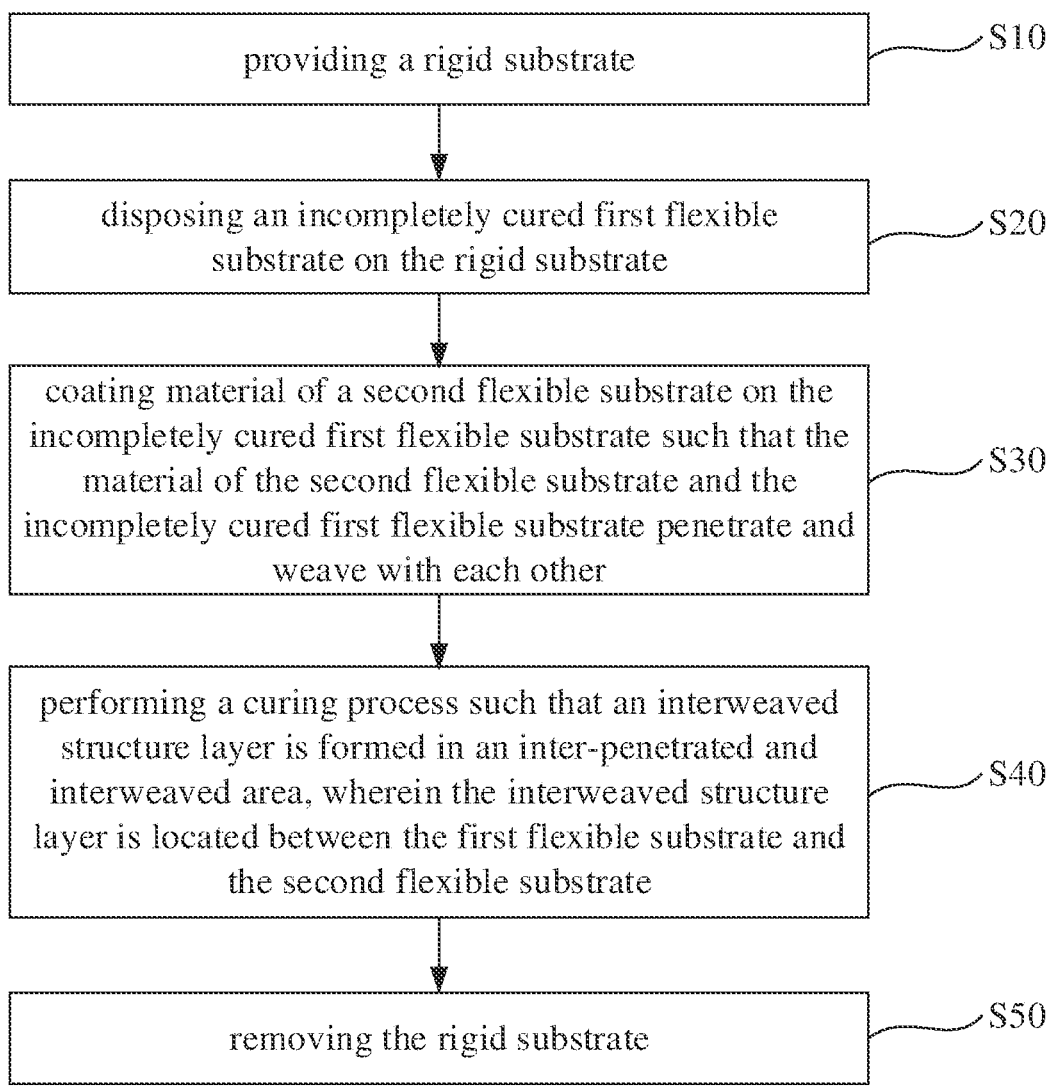
FIG. 2 is a flowchart of a preparation method of a flexible display device substrate according to the present disclosure.
Figure 3:
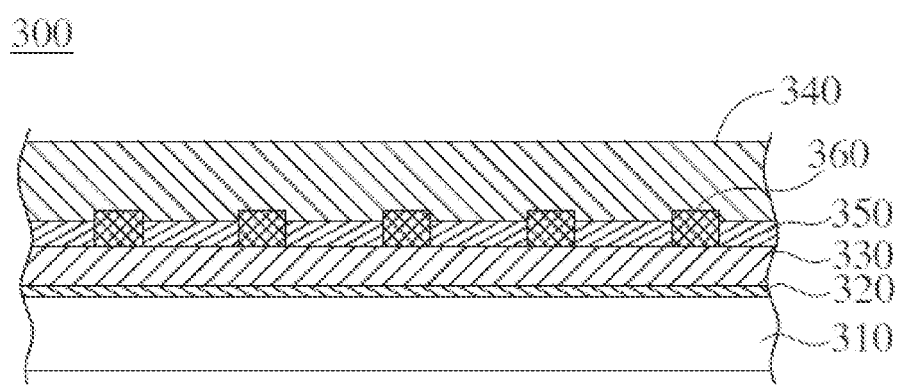
FIG. 3 is a schematic cross-sectional view of a flexible display device substrate before a lift-off process according to the present disclosure.
Figure 4:
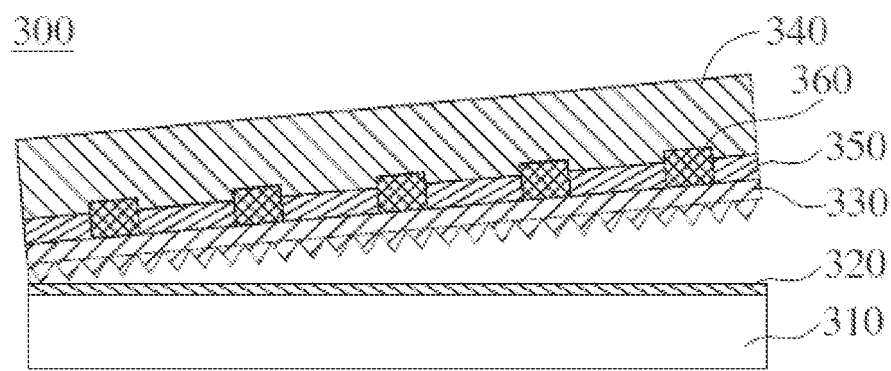
FIG. 4 is a schematic cross-sectional view of a flexible display device substrate after a lift-off process according to the present disclosure.

Referring to FIG. 2 and FIGS. 3-4, the present disclosure uses the flowchart of FIG. 2 to describe the preparation method of the flexible display device substrate 300 of FIGS. 3-4 one by one in detail.

In a preferred embodiment of the present disclosure, a preparation method of a flexible display device substrate is provided, which includes the following steps S10 to S50.

S10: Providing a rigid substrate 310. In one embodiment of the present disclosure, the rigid substrate 310 is an alkali-free glass substrate with high optical transmittance.

Preferably, a surface treatment layer 320 is formed on the rigid substrate 310 by using a surface treatment process, such as an ion treatment, or coating an adhesion promoter (primer). For example, the adhesion promoter is an aminopropyl terminated silane or siloxane coupling agent.

S20: Disposing an incompletely cured first flexible substrate 330 on the rigid substrate 310. The curing degree of the incompletely cured first flexible substrate 330 ranges from 50 to 70%.

In one embodiment of the present disclosure, the first flexible substrate 330 is a transparent polyimide (PI) flexible substrate. The material forming the first flexible substrate 330 derives from a polyamic acid (PAA) solution, and polyimide (PI) can be obtained through dehydration of heating or chemical catalyst. Generally, the polyamic acid (PAA) solution is a blended polyamic acid solution, which is synthesized at low temperature in a polar aprotic solvent. Preferably, the polar aprotic solvent may be selected from one of NMP, DMF and DMAC.

In an embodiment of the present disclosure, a first transparent polyamic acid (PAA) solution is coated on the rigid substrate 310, which has undergone the surface treatment process, that is, on a surface treatment layer 320. Then the incompletely cured first flexible substrate 330 is obtained after the first transparent polyamic acid solution is desolvated and pre-cured.

In an embodiment of the present disclosure, the desolvating condition of the first transparent polyamic acid includes heating the first transparent polyamic acid solution within a first temperature range, for example, 100 to 150° C., for 1~2 hours under a vacuum environment. Then, a pre-curing process is performed, and the pre-curing condition includes heating the first transparent polyamic acid solution within a second temperature range, such as 240° C. for about 0.5 to 1.5 hours under a vacuum environment.

S21: Forming a toughening layer 360 on a part of the first flexible substrate 330. Step 21 (not shown) is performed after step S20 in which the incompletely cured first flexible substrate 330 is disposed on the rigid substrate 310.

In one embodiment of the present disclosure, the toughened layers 360 are formed at intervals on a part of the incompletely cured first flexible substrate 330 by chemical vapor deposition (CVD) and yellow light processes. Since the first flexible substrate 330 is not completely cured, a portion of the toughening layer 360 is embedded/sink into the first flexible substrate 330. In other words, the first flexible substrate 330 surrounds the lower half of the toughening layer 360. Preferably, the toughening layer is a single layer or a layered structure made of amorphous silicon, silicon oxide, or silicon nitride, and the thickness of the toughening layer ranges from 500 to 2000 angstroms.

S30: Coating material of the second flexible substrate 340 on the incompletely cured first flexible substrate 330 such that the material of the second flexible substrate 340 and the incompletely cured first flexible substrate 330 penetrate and interweave with each other. In one embodiment of the present disclosure, the materials forming the first flexible substrate 330 and the second flexible substrate 340 are both polyamic acid (PAA) solutions. A transparent polyimide (PI) flexible substrate is formed after the subsequent curing process is performed.

In other words, the second transparent polyamic acid is coated on the incompletely cured first flexible substrate 330, such that the second transparent polyamic acid and the incompletely cured first flexible substrate 330, as mentioned above (that is, the incompletely pre-cured first transparent polyamic acid) produce a mutual penetrating and weaving phenomenon. Afterward, a mesh-like structure with double-layered transparent flexible substrate is formed through a curing process. In this step, the coated material of the second flexible substrate 340 covers a portion of the toughening layer 360 or covers the upper half of the toughening layer 360.

S40: Performing a curing process such that an interweaved structure layer 350 is formed within an inter-penetrated and interweaved area. The interweaved structure layer 350 is located between the first flexible substrate 330 and the second flexible substrate 340. Preferably, the interweaved structure layer 350 and the toughening layer 360 are interlaced and in contact with each other after the curing process is performed.

In an embodiment of the present disclosure, the curing process includes heating the first flexible substrate 330 and the second flexible substrate 340 at a first temperature, for example, 240° C., for a first predetermined time, for example, about 0.5 to 1.5 hours, and then heating them at a second temperature, for example, 300° C., for a second predetermined time, such as 0.5 hours, and then heating them at a third temperature, such as 350° C., again for the second predetermined time, such as 0.5 hours.

In one embodiment of the present disclosure, the bonding strength between the fully cured first flexible substrate 330 and the rigid substrate 310 is greater than 6.53 N/cm, and the bonding strength between the double-layered polyimide (PI) flexible substrate in the interweaved structure layer 350 is greater than 8.74N/cm.

S50: Removing the rigid substrate 310. In one embodiment of the present disclosure, the interweaved structure layer 350 and the rigid substrate 310 are separated by a laser lift-off process. A schematic cross-sectional view of the flexible display device substrate before a lift-off process is shown in FIG. 3, and the schematic cross-sectional view of the flexible display device substrate after the lift-off process is shown in FIG. 4.

It is worth noting that, during the laser lift-off process, although the first flexible substrate 330 is carbonized and decomposed, the interweaved structure layer 350 and the second flexible substrate 340 are intact. The flexible display device substrate 300 after separation can be used in a variety of flexible transparent displays, such as a flexible LCD, a flexible OLED, and a flexible Micro-LED, and is not limited thereto.

The beneficial effect of the present disclosure is that, compared with the traditional single-layer or double-layer flexible substrate, the present disclosure not only increases the bonding strength between the flexible substrate and the supporting substrate, but also increases the bonding strength between the double-layered flexible substrate through a surface treatment to the supporting substrate (rigid substrate) and by using the double-layer polyimide to form the inter-penetrated and interweaved structure, thereby reducing the interface inertia. Therefore, the risks of warping and transferring of the flexible substrate in the display panel manufacturing process are reduced, and the risks of damage and fragmentation of the flexible display panel during the laser lift-off process are avoided.

Based on the above, the present disclosure has been described with a preferred embodiment thereof, but the above preferred embodiment is not to limit the scope of the present disclosure. Those skilled in the art may make many changes and modifications to the described embodiments without departing from the scope and the spirit of the present disclosure that is intended to be limited only by the appended claims.

What is claimed is:

1. A flexible display device substrate comprising:
first flexible substrate;
a second flexible substrate disposed on the first flexible substrate; and
an interweaved structure layer disposed between the first flexible substrate and the second flexible substrate, wherein the interweaved structure layer is formed by a part of the first flexible substrate and a part of the second flexible substrate weaving and penetrating with each other,
a toughening layer, disposed at intervals between the first flexible substrate and the second flexible substrate, wherein the toughening layer is a layered structure,
wherein a portion of the toughening layer is embedded/sink into the first flexible substrate, the first flexible substrate surrounds a lower half of the toughening layer, and the second flexible substrate covers an upper half of the toughening layer,
a bonding strength between the first flexible substrate and the second flexible substrate in the interweaved structure layer is greater than 8.74N/cm, and
an optical transmissions of the first flexible substrate and the second flexible substrate are greater than 90%, a yellow indexes are less than 2, and a hazes are less than 1.

2. The flexible display device substrate as claimed in claim 1, wherein the toughening layer and the interweaved structure layer are disposed alternately.

3. The flexible display device substrate as claimed in claim 1, wherein a thickness of the second flexible substrate is not lower than a thickness of the first flexible substrate.

* * * * *

UNITED STATES PATENT AND TRADEMARK OFFICE
CERTIFICATE OF CORRECTION

| | |
|---|---|
| PATENT NO. | : 11,670,639 B2 |
| APPLICATION NO. | : 16/627366 |
| DATED | : June 6, 2023 |
| INVENTOR(S) | : Linshuang Li |

It is certified that error appears in the above-identified patent and that said Letters Patent is hereby corrected as shown below:

On the Title Page

Item (73) Assignee: "Shenzhen China Star Optoelectronics Semiconductor Display Technology cO., ITD." should be changed to --Shenzhen China Star Optoelectronics Semiconductor Display Technology Co., Ltd.--.

Signed and Sealed this
Thirteenth Day of February, 2024

Katherine Kelly Vidal
*Director of the United States Patent and Trademark Office*